(12) United States Patent
Kim et al.

(10) Patent No.: US 12,446,170 B2
(45) Date of Patent: Oct. 14, 2025

(54) DISPLAY APPARATUS

(71) Applicant: SAMSUNG ELECTRONICS CO., LTD., Suwon-si (KR)

(72) Inventors: Kyounghwan Kim, Suwon-si (KR); Jeonghoon Park, Suwon-si (KR); Sangki Yoon, Suwon-si (KR); Chanhyuck Yim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 233 days.

(21) Appl. No.: 18/139,472

(22) Filed: Apr. 26, 2023

(65) Prior Publication Data

US 2024/0008198 A1  Jan. 4, 2024

Related U.S. Application Data

(63) Continuation of application No. PCT/KR2023/004376, filed on Mar. 31, 2023.

(30) Foreign Application Priority Data

Jun. 29, 2022 (KR) ........................ 10-2022-0080026

(51) Int. Cl.
*H05K 5/02* (2006.01)
*F16M 11/20* (2006.01)
*H05K 5/30* (2025.01)

(52) U.S. Cl.
CPC ....... *H05K 5/0217* (2013.01); *F16M 11/2085* (2013.01); *F16M 11/2092* (2013.01); *H05K 5/30* (2025.01)

(58) Field of Classification Search
CPC ....... H05K 5/0017; H05K 5/03; H05K 5/0217
(Continued)

(56) References Cited

U.S. PATENT DOCUMENTS

| 10,372,401 B2 | 8/2019 | Ryu et al. |
| 10,626,961 B2 | 4/2020 | Heo et al. |

(Continued)

FOREIGN PATENT DOCUMENTS

| CN | 210715418 U | 6/2020 |
| CN | 111425722 A | 7/2020 |

(Continued)

OTHER PUBLICATIONS

International Search Report (PCT/ISA/210) issued by the International Searching Authority on Jul. 18, 2023 in International Application No. PCT/KR2023/004376.

(Continued)

*Primary Examiner* — Hung S. Bui
(74) *Attorney, Agent, or Firm* — Sughrue Mion, PLLC

(57) ABSTRACT

Disclosed is a display apparatus. The display apparatus includes: a frame; a plurality of display panels detachably mounted on the frame and including a first display panel and a second display panel that are adjacent to each other; and a position adjusting unit provided in the frame and provided between the first display panel and the second display panel. The position adjusting unit includes: a first gear and a second gear configured to be rotatably connected to the frame, a third gear configured to mount the first display panel on a surface of the third gear by being coupled to the frame and by being interlocked with the first gear, and a fourth gear configured to mount the second display panel on a surface of the fourth gear by being coupled to the frame and by being interlocked with the second gear.

16 Claims, 7 Drawing Sheets

(58) Field of Classification Search
USPC .............................. 361/731, 807, 809, 810
See application file for complete search history.

(56) References Cited

U.S. PATENT DOCUMENTS

| | | |
|---|---|---|
| 10,738,934 B2 | 8/2020 | Ahn |
| 2019/0277377 A1 | 9/2019 | Heo et al. |
| 2020/0064677 A1* | 2/2020 | Yoon .................. H01R 13/6205 |
| 2020/0103068 A1 | 4/2020 | Ahn |
| 2020/0380895 A1 | 12/2020 | Nakano |
| 2021/0157371 A1* | 5/2021 | Mori ...................... G09F 9/3026 |
| 2023/0328904 A1* | 10/2023 | Kim ...................... F16B 5/0012 |
| | | 361/730 |

FOREIGN PATENT DOCUMENTS

| | | |
|---|---|---|
| CN | 113700996 A | 11/2021 |
| JP | 2016-142861 A | 8/2016 |
| JP | 6378104 B2 | 8/2018 |
| JP | 6425858 B1 | 11/2018 |
| KR | 10-1705511 B1 | 3/2017 |
| KR | 10-2019-0106080 A | 9/2019 |
| KR | 10-2020-0036490 A | 4/2020 |
| KR | 10-2272059 B1 | 7/2021 |
| WO | 2022/045818 A1 | 3/2022 |

OTHER PUBLICATIONS

Written Opinion (PCT/ISA/237) issued by the International Searching Authority on Jul. 18, 2023 in International Application No. PCT/KR2023/004376.
Communication issued on Apr. 29, 2025 by the European Patent Office in European Patent Application No. 23831675.6.

* cited by examiner

DISPLAY APPARATUS

CROSS-REFERENCE TO RELATED APPLICATION(S)

This application is a bypass continuation of International Application No. PCT/KR2023/004376, filed on Mar. 31, 2023, in the Korean Intellectual Property Receiving Office, which is based on and claims priority to Korean Patent Application No. 10-2022-0080026, filed on Jun. 29, 2022, in the Korean Intellectual Property Office, the disclosures of which are incorporated by reference herein in their entireties.

BACKGROUND

1. Field

The disclosure relates to a display apparatus and, more particularly to, a display apparatus of which a position of panels may be adjusted.

2. Description of Related Art

Demand for a display apparatus having high brightness, high resolution, enlargement, high efficiency, and low power is continuously increasing. Thus, a new product to replace or supplement a liquid crystal display (LCD) panel and an organic light-emitting diode (OLED) panel is actively studied. A modular display apparatus has a large-sized screen by consecutively tiling a plurality of panels.

However, the modular display apparatus has a problem in that image quality degradation and a sense of difference may occur due to a gap and a step between modules (i.e., panels).

SUMMARY

Provided are a display apparatus having multiple display panels and capable of precisely adjusting positions of the multiple display panels and a method thereof.

According to an aspect of the disclosure, a display apparatus includes: a frame; a plurality of display panels detachably mounted on the frame and including a first display panel and a second display panel that are adjacent to each other; and a position adjusting unit provided in the frame and provided between the first display panel and the second display panel. The position adjusting unit includes: a first gear and a second gear configured to be rotatably connected to the frame, a third gear configured to mount the first display panel on a surface of the third gear by being coupled to the frame and by being interlocked with the first gear, and a fourth gear configured to mount the second display panel on a surface of the fourth gear by being coupled to the frame and by being interlocked with the second gear.

The third gear may be coupled to the frame via a first screw and the fourth gear may be coupled to the frame via a second screw.

The first display panel and the second display panel may be configured to be adjacently provided in a left side and a right side of the display apparatus, respectively.

Each of the first gear and the second gear may include a guide groove configured to receive a tool inserted therein for rotating the first gear or the second gear.

The guide groove may extend in a vertical direction.

The first gear may be provided further to a left of the display apparatus than the second gear.

The first gear may be provided at a lower side of the second gear.

The third gear may be provided further to a left side of the display apparatus than the fourth gear.

A height of the third gear may be the same as a height of the fourth gear.

The frame may include: a first hole and a second hole, wherein the first gear and the second gear respectively penetrate into the first hole and the second hole, and a third hole and a fourth hole, wherein the third gear and the fourth gear respectively penetrate into the third hole and the fourth hole.

The frame may include: a base; and a rib member protruding in a front side further than the base. The rib member supports the position adjusting unit and has a hollow at which rear ends of the first gear, the second gear, the third gear, and the fourth gear are provided.

Additional position adjusting units may be provided and spaced apart each other along a vertical line that partitions the plurality of display panels.

The plurality of display panels may be provided slidable in left or right directions of the frame.

The plurality of display panels may include a hook member at an upper side, and the frame comprises a guide to support the hook member upward to be slidable in a right direction and a left direction.

A display apparatus includes: a frame; a first display panel configured to be detachably mounted on the frame; a first gear configured to be rotatably connected to the frame; and a third gear configured to be interlocked with the first gear and to be coupled to the frame. The third gear is configured to mount the first display panel on a surface of the third gear and to move the first display panel in a first direction.

The third gear may be configured to move the first display panel in the first direction, based on a rotational force applied to the third gear.

The display apparatus may further include: a second display panel configured to be detachably mounted on the frame; a second gear configured to be rotatably connected to the frame; and a fourth gear configured to be interlocked with the second gear and to be coupled to the frame. The fourth gear is configured to mount the second display panel on a surface of the fourth gear and to move the second display panel in a second direction.

The fourth gear may be configured to move the second display panel in the second direction, based on a rotational force applied to the fourth gear.

BRIEF DESCRIPTION OF DRAWINGS

The above and other aspects, features, and advantages of certain embodiments of the disclosure will be more apparent from the following description taken in conjunction with the accompanying drawings, in which.

DETAILED DESCRIPTION

Figure 1:
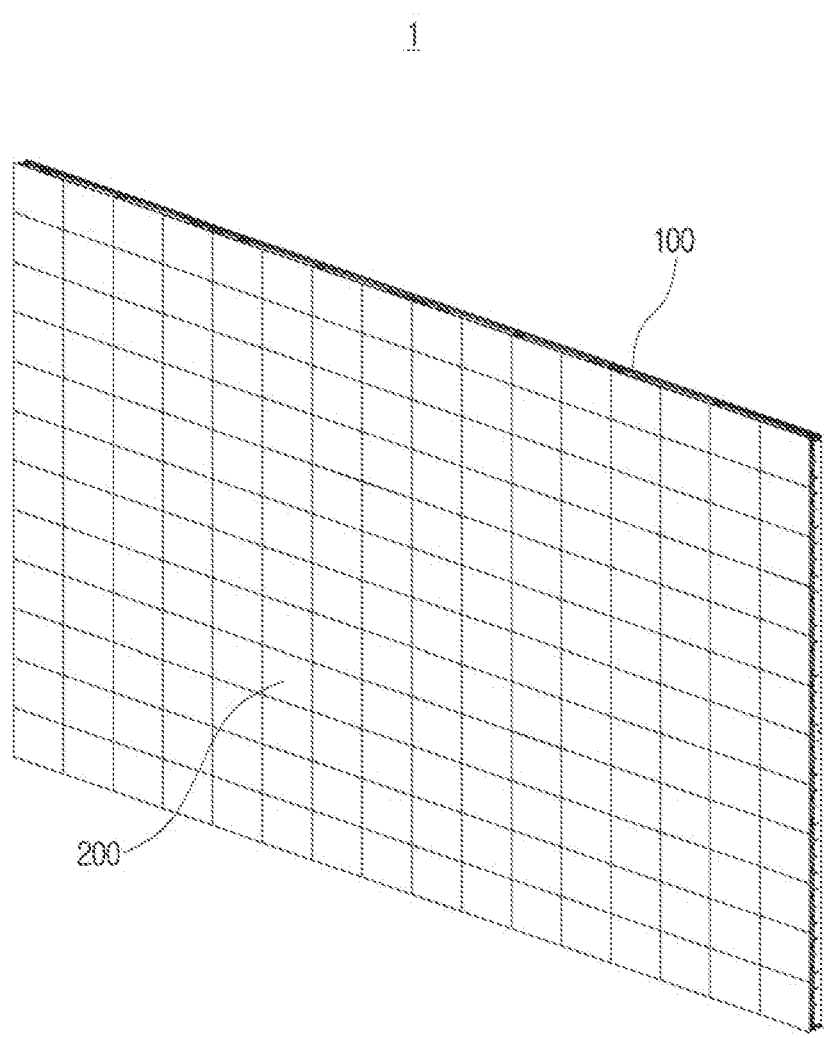
FIG. 1 illustrates a display apparatus according to an embodiment of the disclosure.

Before undertaking the detailed description below, it may be advantageous to set forth definitions of certain words and phrases used throughout the present disclosure. The terms "include" and "comprise", and the derivatives thereof refer to inclusion without limitation. In other words, as used herein, the term "has," "may have," "includes" or "may include" indicates existence of a corresponding feature (e.g., a numerical value, a function, an operation, or a constituent element such as a component), but does not exclude existence of an additional feature.

The term "or" is an inclusive term meaning "and/or". The phrase "associated with," as well as derivatives thereof, refer to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of A, B, and C" includes any of the following combinations: only A, only B, only C, both A and B, both A and C, both B and C, or all of A, B, and C. Similarly, the term "set" means one or more. Accordingly, the set of items may be a single item or a collection of two or more items.

Definitions for other certain words and phrases are provided throughout this disclosure. Those of ordinary skill in the art should understand that in many if not most instances, such definitions apply to prior as well as future uses of such defined words and phrases.

Examples described hereinafter are for easy understanding of the disclosure, and it should be understood that various changes can be made to examples described herein and the disclosure can be embodied in different forms. In addition, in the following description, detailed descriptions of well-known functions or configurations will be omitted since they would unnecessarily obscure the subject matters of the disclosure.

In addition, it should be noted that the drawings as attached are just for easy understanding of the disclosure, and are not illustrated as really scaled, and dimensions of some elements may be exaggerated. Embodiments of the disclosure will be described in detail with reference to the accompanying drawings, but the disclosure is not limited to embodiments described herein. The disclosure will be described in detail with reference to the drawings.

General terms that are currently widely used were selected as terms used in embodiments of the disclosure in consideration of functions in the disclosure, but may be changed depending on the intention of those skilled in the art or a judicial precedent, the emergence of a new technique, and the like. In addition, in a specific case, terms arbitrarily chosen by an applicant may exist. In this case, the meaning of such terms will be mentioned in detail in a corresponding description portion of the disclosure. Therefore, the terms used in embodiments of the disclosure should be defined on the basis of the meaning of the terms and the contents throughout the disclosure rather than simple names of the terms.

In the disclosure, components required for the description of each embodiment of the disclosure are described and thus, the embodiment is not necessarily limited thereto. Accordingly, some components may be changed or omitted and other components may be added. In addition, components may be disposed and arranged in different independent devices.

Figure 2:
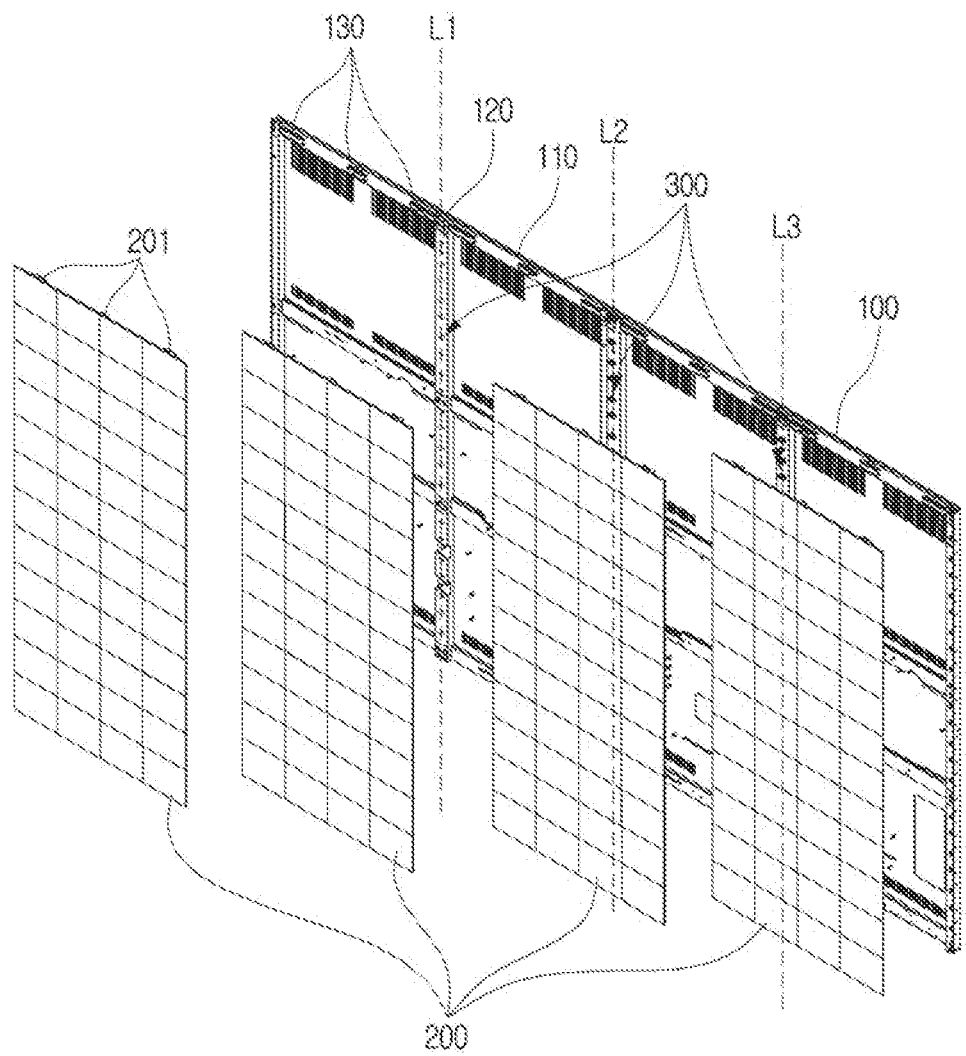
FIG. 2 illustrates the display apparatus of FIG. 1.
Figure 3:
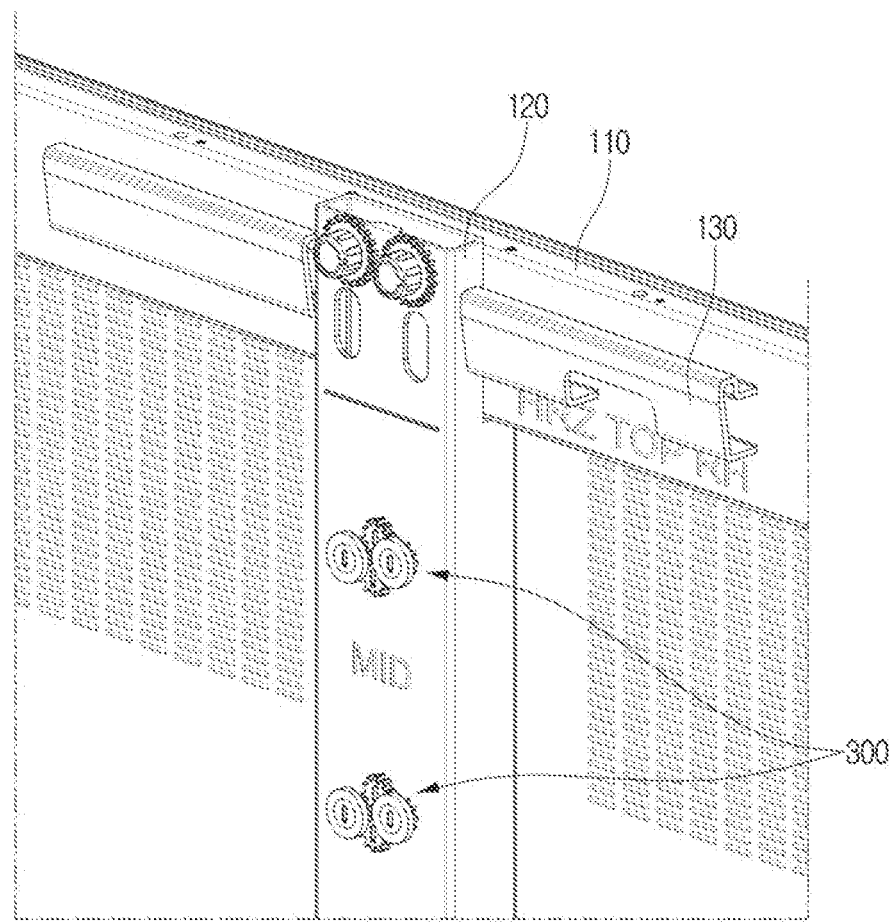
FIG. 3 illustrates that the first and second display panels are spaced apart in left directions and right directions according to an embodiment of the disclosure.

FIG. 1 is a perspective view of a display apparatus according to an embodiment of the disclosure; FIG. 2 is an exploded perspective view of the display apparatus of FIG. 1; FIG. 3 is a front view illustrating that the first and second display panels are spaced apart in left directions and right directions.

According to an embodiment, a display apparatus 1 may include a plurality of display panels 200. The display apparatus 1 may display a video signal. The display apparatus 1 may be implemented as a television (TV), but is not limited thereto, and may be applicable to any device having a display function such as a video wall, a large format display (LFD), a digital signage, and a digital information display (DID), or the like.

In addition, the display apparatus 1 may be various types displays, such as a liquid crystal display (LCD), an organic light-emitting diode (OLED), a liquid crystal on silicon (LCoS), a digital light processing (DLP), a quantum dot (QD) display panel, a quantum dot light-emitting diodes (QLED), or the like.

According to an embodiment, the display apparatus 1 may include a plurality of display panels (or a cabinet) 200. For example, as shown in FIG. 1, four display panels 200 may be coupled along left and right directions to implement one display apparatus 1. Each of the plurality of display panels 200 according to an embodiment of the disclosure may include a plurality of self-luminous elements, such as a light-emitting diode (LED) or a micro LED.

Each of the plurality of display panels 200 may be an LED cabinet including a plurality of LED elements. According to one embodiment, the LED element may be implemented as a red/green/blue (RGB) LED, which may include red LED, green LED, and blue LED. In addition, the LED element may additionally include a white LED, in addition to the RGB LED. The LED element may be a micro LED. Here, the micro LED may be a LED at a size of about 5 to 100 micrometers and may be a micro-sized light-emitting element that emits light by itself without a color filter.

Referring to FIGS. 1 to 3, the display apparatus 1 according to an embodiment of the disclosure may include a frame 100, the plurality of display panels 200, and a position adjusting unit 300.

Referring to FIG. 1, the display apparatus 1 includes the frame 100 that supports the display panel 200. The display panel 200 may implement a screen of the display apparatus 1.

The frame 100 according to an embodiment may have an approximately rectangular shape, and may include a frame body covering the rear of the display panel 200 and a frame cover surrounding the edge portion of the frame body. In one embodiment, the frame cover may form an outer appearance of an upper surface, an outer appearance of a lower surface, and an outer appearance of a side surface of the display apparatus 1.

According to an embodiment of the disclosure, the display apparatus 1 may include a device board. The device board may include a switching mode power supply (SMPS) provided to supply power required for driving the display apparatus 1, at least one printed circuit board (PCB), and a signal processing board for processing data.

The device board may be disposed on the frame 100, but is not limited thereto, and may be disposed on the display panel 200. The device board may be provided in the same number as the number of display panels 200. For example, four device boards may supply power and image data to each of the four display panels 200. A sub-board and a cable for receiving data from each device board may be respectively arranged in the plurality of display panels 200. The display panel 200 may receive image data from the device board and display an image.

The plurality of display panels 200 may be detachably mounted on a frame 100. According to an embodiment, the rear surface of the display panel 200 may be attached to or detached from the front surface of the frame 100 by a magnetic force. For example, a plurality of first coupling members disposed on the front surface of the frame 100 and a plurality of second coupling members disposed on the rear surface (or the rear surface) of the display panel 200 may be detachably coupled to each other by attraction.

As illustrated in FIG. 2, the position adjusting unit 300 is provided in the frame 100 and may be disposed between the first display panel 210 and the second display panel 220 disposed adjacent to each other in the left and right directions among the plurality of display panels 200. The position adjusting unit 300 may move the first display panel 210 and the second display panel 220, and thus arrange the panels in left and right directions or toward front or rear directions. Accordingly, steps or gaps between the front and rear sides of the first display panel 210 and the second display panel 220 may be adjusted.

As illustrated in FIG. 2, a plurality of position adjusting units 300 are provided to be spaced apart from each other along vertical lines (L1, L2, L3) dividing the plurality of display panels 200. Each of the vertical lines (L1, L2, L3) may be a virtual line defining a boundary in the vertical direction of the display panel 200. For example, when four display panels 200 are arranged as illustrated in FIG. 2, three vertical lines (L1, L2, L3) may be used.

The plurality of display panels 200 may be arranged to be slidable in left and right directions in the frame 100. Accordingly, the plurality of display panels 200 may move to the left direction or the right direction while being mounted on the frame 100.

For example, a user may mount the first display panel 210 and the second display panel 220 on the frame 100 to form a gap in which the position adjusting unit 300 is exposed between the first display panel 210 and the second display panel 220. Then, the user may adjust a step (or a distance) between front and rear sides of the first display panel 210 and the second display panel 220 by using the position adjusting unit 300. Thus, the first display panel 210 and the second display panel 220 may be slid to the left direction and to the right direction so that the gap formed between the first display panel 210 and the second display panel 220 may be removed, and the position adjusting unit 300 may be hidden by the first display panel 210 and the second display panel 220.

As illustrated in FIG. 2, for example, the plurality of display panels 200 may include a hook member 201 at the upper end of the display panel 200. As illustrated in FIG. 3, the frame 100 may include a guide 130 for supporting the hook member 201 upward in the left and right directions. Accordingly, the plurality of display panels 200 may slide to the left direction or the right direction while the hook member 201 is hung on the guide 130.

Figure 4:
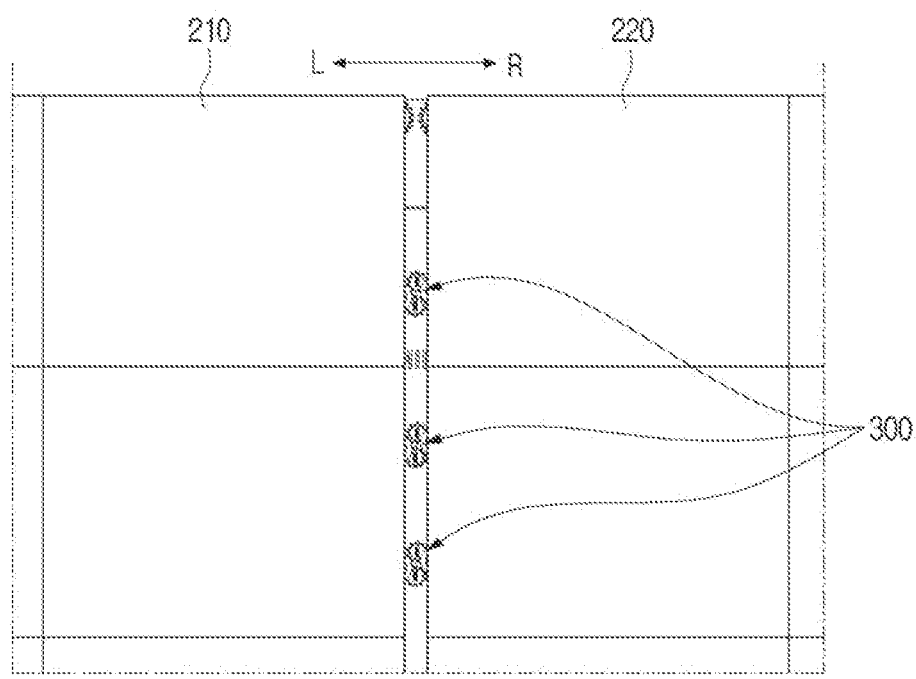
FIG. 4 illustrates a structure in which a position adjusting unit is coupled to a frame according to an embodiment of the disclosure.
Figure 5:
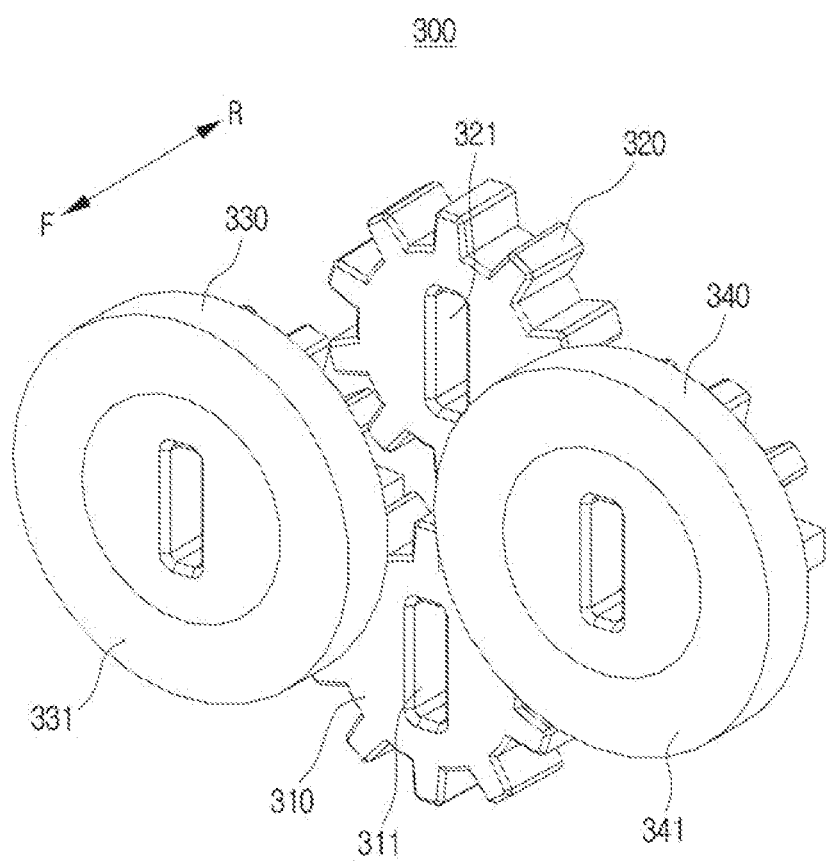
FIG. 5 illustrates a detailed structure of the position adjusting unit according to an embodiment of the disclosure.
Figure 6:
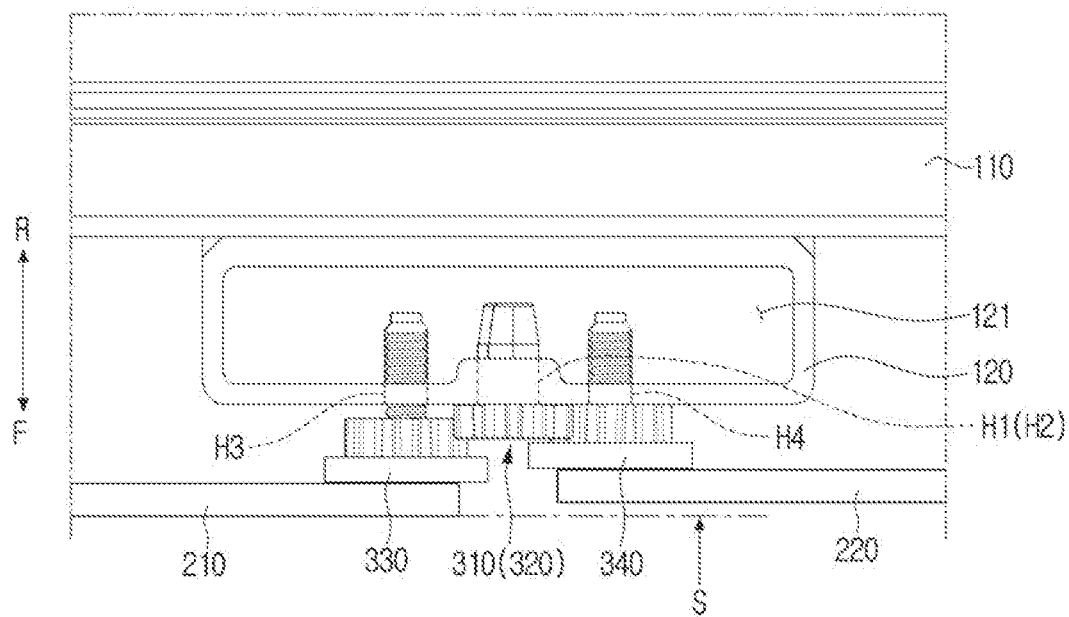
FIGS. 6 and 7 illustrate a process of adjusting a step of a display according to an embodiment of the disclosure.
Figure 7:
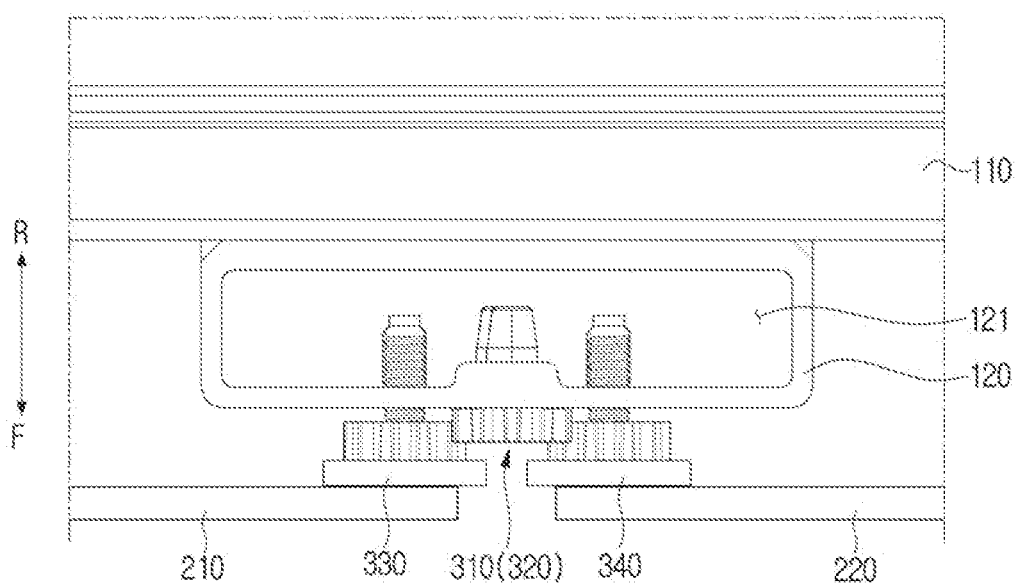

FIG. 4 is a perspective view illustrating a structure in which a position adjusting unit is coupled to a frame. FIG. 5 is a perspective view illustrating a detailed structure of the position adjusting unit; and FIGS. 6 and 7 are top views illustrating a process of adjusting a step of a display.

Referring to FIGS. 4 to 7, the position adjusting unit 300 may include a first gear 310, a second gear 320, a third gear 330, and a fourth gear 340.

The first gear 310 and the second gear 320 may be rotatably connected to the frame 100. In one embodiment, the first gear 310 and the second gear 320 may rotate around a rotation axis extending along the front and rear sides.

The third gear 330 is coupled to the frame 100 (e.g., by a screw) and is engaged (e.g., interlocked) with the first gear 310. The first display panel 210 may be mounted on a front surface 331 of the third gear 330.

The fourth gear 340 may be coupled to the frame 100 (e.g., by a screw) and disposed to be engaged (e.g., interlocked) with the second gear 320. The second display panel 220 may be mounted on a front surface 341 of the fourth gear 340.

The third gear 330 and the fourth gear 340 are coupled to the frame 100 (e.g., by a screw), so that the rotational movement and the forward/backward straight movement of the gears may be interlocked. That is, when the third gear 330 and the fourth gear 340 rotate in one direction, the third gear 330 and the fourth gear 340 may move forward ("F" in FIG. 5) along the screw. Also, the third gear 330 and the fourth gear 340 may move backward or in a rear direction ("R" in FIG. 5) along the screw when the third gear 330 and the fourth gear 340 rotate in the other direction.

When the user rotates the first gear 310 and the second gear 320, the third gear 330 and the fourth gear 340, which are engaged (e.g., interlocked) with the first gear 310 and the second gear 320, may rotate, and the third gear 330 and the fourth gear 340 may move forward or backward at the same time. Accordingly, a step between the first display panel 210 and the second display panel 220 may be adjusted or removed.

In one embodiment, the first gear 310 may be disposed at a lower side of the second gear 320. In one embodiment, the first gear 310 may be disposed to be more left than the second gear 320. For example, the first gear 310 may be eccentrically disposed to the left side than the virtual vertical line, and the second gear 320 may be eccentrically disposed to the right side than the virtual vertical line.

Accordingly, when the user rotates the first gear 310 that is eccentric to the left, the user may move the first display panel 210 disposed on the left side, and when the second gear 320 (eccentric to the right) is rotated, the user may easily recognize that the second display panel 220 disposed on the right side may move.

The third gear 330 may be disposed on the left side than the fourth gear 340. The third gear 330 may be disposed at a height corresponding to a height of the fourth gear 340. Accordingly, one point of the first display panel 210 in contact with the third gear 330 and one point of the second display panel 220 in contact with the fourth gear 340 may be located at the same height.

That is, the adjustment of the step of first and second display panels 210, 220 are made at the same height with respect to the vertical direction, the user may adjust the step of the first display panel 210 and the second display panel 220 more precisely.

The first gear 310 and the second gear 320 may include guide a first guide groove 311 and a second guide groove 321 into which a tool for rotating the first gear 310 and the second gear 320 may be inserted. The user may rotate the first gear 310 and the second gear 320 by inserting a tool into the first guide groove 311 of the first gear 310 and the second guide groove 321 of the second gear 320, instead of directly rotating the gear blades of the first gear 310 and the second gear 320. Accordingly, the user may easily rotate the first gear 310 and the second gear 320 with high force transmission efficiency.

In one embodiment, each of the first guide groove 311 of the first gear 310 and the second guide groove 321 of the second gear 320 may have a shape of a long groove in a vertical direction. The guide grooves 311, 321 may have a non-circular shape. Accordingly, a user may easily rotate the first gear 310 and the second gear 320 with high force transmission efficiency.

As illustrated in FIG. 6, the frame 100 may include a first hole H1 and a second hole H2 through which the first gear 310 and the second gear 320 pass, respectively. The frame 100 may also include a third hole H3 and a fourth hole H4 through which the third gear 330 and the fourth gear 340 pass, respectively. Screws engaged with the third gear 330 and the fourth gear 340 may be formed on inner circumferential surfaces of the third hole H3 and the fourth hole H4.

The frame 100 may include a base 110 and a rib member 120. The base 110 may be a plate arranged in parallel with the display panel 200. The rib member 120 may be arranged to protrude in front of the base 110 to support the position adjusting unit 300.

The rib member 120 may be elongated along a plurality of vertical lines (L1, L2, L3). The rib member 120 may have a hollow 121 in which the rear ends of the first to fourth gears 310, 320, 330, 340 are arranged. The rib member 120 may be penetrated by the first gear 310, the second gear 320, the third gear 330, and the fourth gear 340.

Even if the third gear 330 and the fourth gear 340 move forward or backward, they may freely move inside the hollow 121 formed in the rib member 120 without interfering with the frame 100.

Referring to FIG. 6, the second display panel 220 may be disposed to be stepped rearward by a step "S" as compared to the first display panel 210. Accordingly, the user may rotate the second gear 320 in one direction. Thereafter, the fourth gear 340 rotates by being engaged with the second gear 320, and is coupled to the frame 100 by a screw so that the fourth gear 340 may move forward at the same time. As shown in FIG. 7, the second display panel 220 mounted on the front surface 341 of the fourth gear 340 may move forward to be arranged, thus the step ("S") with respect to the first display panel 210 is removed.

The disclosure is not limited to the specific embodiments described above, but various modifications can be made by one of ordinary skill in the art to which the disclosure belongs without departing from the subject matter of the disclosure claimed in the claims, and such modifications are within the scope of the claims.

What is claimed is:

1. A display apparatus comprising:
a frame;
a plurality of display panels detachably mounted on the frame, wherein the plurality of display panels comprises a first display panel and a second display panel that are adjacent to each other; and
a position adjusting unit provided in the frame and between the first display panel and the second display panel,
wherein the position adjusting unit comprises:
a first gear rotatably connected to the frame,
a second gear rotatably connected to the frame,
a third gear configured to mount the first display panel on a surface of the third gear by being coupled to the frame and by being interlocked with the first gear, and
a fourth gear configured to mount the second display panel on a surface of the fourth gear by being coupled to the frame and by being interlocked with the second gear.

2. The display apparatus of claim 1, wherein the third gear is coupled to the frame via a first screw and the fourth gear is coupled to the frame via a second screw.

3. The display apparatus of claim 1, wherein each of the first gear and the second gear comprises a guide groove configured to receive a tool inserted therein for rotating the first gear or the second gear.

4. The display apparatus of claim 3, wherein the guide groove extends in a vertical direction.

5. The display apparatus of claim 1, wherein the first gear is disposed further to a left of the display apparatus than the second gear.

6. The display apparatus of claim 1, wherein the first gear is disposed at a lower side of the second gear.

7. The display apparatus of claim 1, wherein the third gear is provided further to a left side of the display apparatus than the fourth gear.

8. The display apparatus of claim 1, wherein a height of the third gear is the same as a height of the fourth gear.

9. The display apparatus of claim 1, wherein the frame comprises:
a first hole and a second hole through which the first gear and the second gear penetrate respectively, and
a third hole and a fourth hole through which the third gear and the fourth gear penetrate respectively.

10. The display apparatus of claim 1, wherein the frame comprises:
a base; and
a rib member protruding in a front side further than the base, and
wherein the rib member supports the position adjusting unit and has a hollow at which rear ends of the first gear, the second gear, the third gear, and the fourth gear are disposed.

11. The display apparatus of claim 1, wherein additional position adjusting units are provided and spaced apart each other along a vertical line that partitions the plurality of display panels.

12. The display apparatus of claim 1, wherein the plurality of display panels are slidable in left or right directions in the frame.

13. The display apparatus of claim 12, wherein the plurality of display panels comprise a hook member at an upper side, and
wherein the frame comprises a guide to support the hook member upward to be slidable in a right direction and a left direction.

14. A display apparatus comprising:
a frame;
a first display panel detachably mounted on the frame;
a first gear rotatably connected to the frame;
a third gear interlocked with the first gear and coupled to the frame;
a second display panel detachably mounted on the frame;
a second gear rotatably connected to the frame; and
a fourth gear configured to be interlocked with the second gear and to be coupled to the frame, wherein the third gear is configured to mount the first display panel on a surface of the third gear and to move the first display panel in a first direction, and wherein the fourth gear is configured to mount the second display panel on a surface of the fourth gear and to move the second display panel in a second direction.

15. The display apparatus of claim 14, wherein the third gear is configured to move the first display panel in the first direction, based on a rotational force applied to the third gear.

16. The display apparatus of claim 14, wherein the fourth gear is configured to move the second display panel in the second direction, based on a rotational force applied to the fourth gear.

* * * * *